(12) United States Patent
Park

(10) Patent No.: US 8,773,911 B2
(45) Date of Patent: Jul. 8, 2014

(54) SEMICONDUCTOR DEVICE AND ERASE METHODS THEREOF

(75) Inventor: Young Soo Park, Seoul (KR)

(73) Assignee: SK Hynix Inc., Gyeonggi-do (KR)

(*) Notice: Subject to any disclaimer, the term of this patent is extended or adjusted under 35 U.S.C. 154(b) by 123 days.

(21) Appl. No.: 13/455,016

(22) Filed: Apr. 24, 2012

(65) Prior Publication Data

US 2012/0275232 A1 Nov. 1, 2012

(30) Foreign Application Priority Data

Apr. 26, 2011 (KR) .................. 10-2011-0038984

(51) Int. Cl.
*G11C 16/04* (2006.01)

(52) U.S. Cl.
USPC ............. 365/185.19; 365/185.22; 365/185.24

(58) Field of Classification Search
USPC ............. 365/185.19, 185.22, 185.23, 185.24, 365/185.25, 185.29
See application file for complete search history.

(56) References Cited

U.S. PATENT DOCUMENTS

| 8,374,038 | B2 * | 2/2013 | Yu et al. .................. 365/185.29 |
| 2009/0147572 | A1 * | 6/2009 | Aritome .................. 365/185.03 |
| 2010/0226173 | A1 * | 9/2010 | Tanaka et al. .............. 365/185.3 |

FOREIGN PATENT DOCUMENTS

| KR | 1020110001067 A | 1/2011 |
| KR | 1020110001080 A | 1/2011 |

* cited by examiner

*Primary Examiner* — Gene Auduong
(74) *Attorney, Agent, or Firm* — William Park & Associates Patent Ltd.

(57) ABSTRACT

An erase method of a semiconductor device includes performing an operation comprised of supplying an erase pulse to erase the memory cells of a memory block, performing an erase verify operation for detecting memory cells of the memory block having threshold voltages dropped to a target erase voltage, from among the memory cells, performing a pre-program operation on the memory cells having the threshold voltages dropped to the target erase voltage, if, as a result of the erase verify operation, the memory block comprises memory cells having the threshold voltages higher than the target erase voltage and the memory cells having the threshold voltages dropped to the target erase voltage, and repeating the operation of supplying an erase pulse, the erase verify operation, and the pre-program operation until the threshold voltages of all the memory cells drop to the target erase voltage.

49 Claims, 8 Drawing Sheets

SEMICONDUCTOR DEVICE AND ERASE METHODS THEREOF

CROSS-REFERENCE TO RELATED APPLICATION

The present application claims priority under 35 U.S.C. §119(a) to Korean patent application number 10-2011-0038984 filed on Apr. 26, 2011, in the Korean Intellectual Property Office, the entire disclosure of which is incorporated by reference herein.

BACKGROUND

1. Technical Field

Example embodiments relate to a semiconductor device and erase methods thereof and, more particularly, to a semiconductor device and erase methods, which can reduce the distribution width of the threshold voltages of memory cells.

2. Related Art

A semiconductor device includes a memory cell array including a plurality of memory blocks. Each of the memory blocks includes a plurality of memory cells.

An erase operation of the semiconductor device is performed on a memory block, selected from among the plurality of memory blocks. If the erase operation is performed when the memory cells of the selected memory block are programmed in various states, a distribution of the threshold voltages of the erased memory cells becomes very wide. This is described with reference to the following graph.

FIG. 1 is a graph illustrating threshold voltages of memory cells according to a known erase operation.

Recently, a multi-level cell (MLC) programmed in various levels is chiefly used. Accordingly, the threshold voltages of memory cells included in a memory block have various distributions 10a, 10b, and 10c. An example in which a memory cell is programmed in three states is shown in FIG. 1. In a program state, the first state 10a is a state in which the threshold voltages of memory cells are the lowest, the second state 10b is a state in which the threshold voltages of the memory cells are higher than the first state 10a, and the third state 10c is a state in which the threshold voltages of the memory cells are higher than the second state 10b. If memory cells having different program states as described above are erased, memory cells having the first state 10a attain the erase state 20 earlier than memory cells having the second or the third state 10b or 10c. Accordingly, when the memory cells of the third state 10c are erased, the threshold voltages of memory cells having the first or second state 10a or 10b which have been erased are further lowered because the threshold voltages of the erased memory cells are influenced by an erase pulse. If the threshold voltages 20 of the memory cells of an erased memory block are lowered as described above, the width W1 in the distribution of the threshold voltages is widened. As a result, the time taken to perform a subsequent program operation may be increased.

BRIEF SUMMARY

Example embodiments relate to preventing a drop in the threshold voltages of erased memory cells and an increase of the distribution width of the threshold voltages of all the memory cells in such a way as to reduce a difference between the threshold voltages of all the memory cells of a memory block by raising the threshold voltages of the erased memory cells and then perform an erase operation again, if memory cells not erased by an erase operation exist in the memory block.

An erase method of a semiconductor device according to an aspect of the present disclosure includes performing an operation comprised of supplying an erase pulse to erase the memory cells of a memory block, performing an erase verify operation for detecting memory cells of the memory block having threshold voltages dropped to a target erase voltage, performing a pre-program operation on the memory cells having the threshold voltages dropped to the target erase voltage, if, as a result of the erase verify operation, the memory block comprises memory cells having the threshold voltages higher than the target erase voltage and the memory cells having the threshold voltages dropped to the target erase voltage, and repeating the operation of supplying an erase pulse, the erase verify operation, and the pre-program operation until the threshold voltages of all the memory cells drop to the target erase voltage.

An erase method of a semiconductor device according to another aspect of the present disclosure includes performing an erase operation comprised of erasing memory cells included in a plurality of strings by performing an operation of supplying an erase pulse to a memory block including the strings, performing an erase verify operation for verifying whether the threshold voltages of the memory cells have dropped to a target erase voltage, and finishing the erase operation if, as a result of the erase verify operation, the threshold voltages of all the memory cells have dropped to the target erase voltage, and performing a pre-program operation for raising the threshold voltages of the erased memory cells if, as a result of the erase verify operation, a memory cell having a threshold voltage not dropped to the target erase voltage exists in the memory cells, wherein the operation of supplying the erase pulse, the erase verify operation, and the pre-program operation are repeated until the threshold voltages of all the memory cells drop to the target erase voltage.

An erase method of a semiconductor device according to yet another aspect of the present disclosure includes performing an erase operation comprised of erasing memory cells of a memory block by supplying an erase pulse to the memory block including even and odd strings, performing a first erase verify operation on the even strings, performing a first program operation for reducing a difference between the threshold voltages of memory cells included in the even strings if a result of the first erase verify operation is a fail, repeating the operation of supplying the erase pulse, the first erase verify operation, and the first program operation until a result of the first erase verify operation is a pass, performing a second erase verify operation on the odd strings if a result of the first erase verify operation is a pass, performing a second program operation for reducing a difference between the threshold voltages of memory cells included in the odd strings if a result of the second the erase verify operation is a fail, repeating the operation of supplying the erase pulse, the first erase verify operation, the second erase verify operation, and the second program operation until a result of the second erase verify operation is a pass, and finishing the erase operation if a result of the second erase verify operation is a pass.

An erase method of a semiconductor device according to further yet another aspect of the present disclosure includes performing an erase verify operation for verifying whether the threshold voltages of all memory cells included in a memory block is lower than a target erase voltage, repeating a pre-program operation until the threshold voltages of erased memory cells, from among all the memory cells, reach a target program voltage, if a result of the erase verify operation is a fail, performing an erase operation by supplying an erase pulse to erase all the memory cells when the threshold voltages of the erased memory cells reach the target program voltage, and repeating the erase verify operation, the pre-program operation, and the operation of supplying the erase pulse until the threshold voltages of all the memory cells drop to the target erase voltage.

An erase method of a semiconductor device according to further yet another aspect of the present disclosure includes performing a first erase verify operation on even strings, repeating a first program operation until the threshold voltages of erased memory cells included in the even strings reach a first target voltage, if a result of the first erase verify operation is a fail, performing a second erase verify operation on odd strings, if a result of the first erase verify operation is a pass or the threshold voltages of all the memory cells included in the even strings reach the first target voltage, repeating a second program operation until the threshold voltages of erased memory cells included in the odd strings reach a second target voltage, if a result of the second erase verify operation is a fail, performing an erase operation for erasing the even and odd strings by supplying an erase pulse, if the threshold voltages of all the memory cells included in the odd strings reach the second target voltage, and repeating the first erase verify operation, the second erase verify operation, the second program operation, and the operation of supplying the erase pulse until a result of the second erase verify operation is a pass.

A semiconductor device according to an aspect of the present disclosure includes a memory block configured to comprise a plurality of memory cells, a circuit group configured to detect the program state or the erase state of the memory cells, and a controller configured to control the circuit group so that a pre-program operation for memory cells having threshold voltages dropped to a target voltage, an operation of supplying an erase pulse until the threshold voltages of all the memory cells drop to the target voltage, an operation of detecting the erase state, and the pre-program operation are repeated if, as a result of the detection of the erase state, the memory cells having the threshold voltages dropped to the target voltage and memory cells having threshold voltages not dropped to the target voltage are mixed.

DESCRIPTION OF EMBODIMENTS

Hereinafter, embodiments of the present disclosure will be described in detail with reference to the accompanying drawings. The figures are provided to allow those having ordinary skill in the art to understand a scope of the embodiments of the disclosure.

Figure 1:
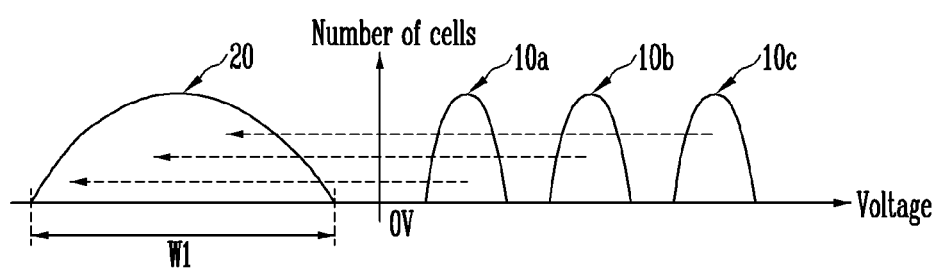
FIG. 1 is a graph illustrating the threshold voltages of memory cells according to a known erase operation.
Figure 2:
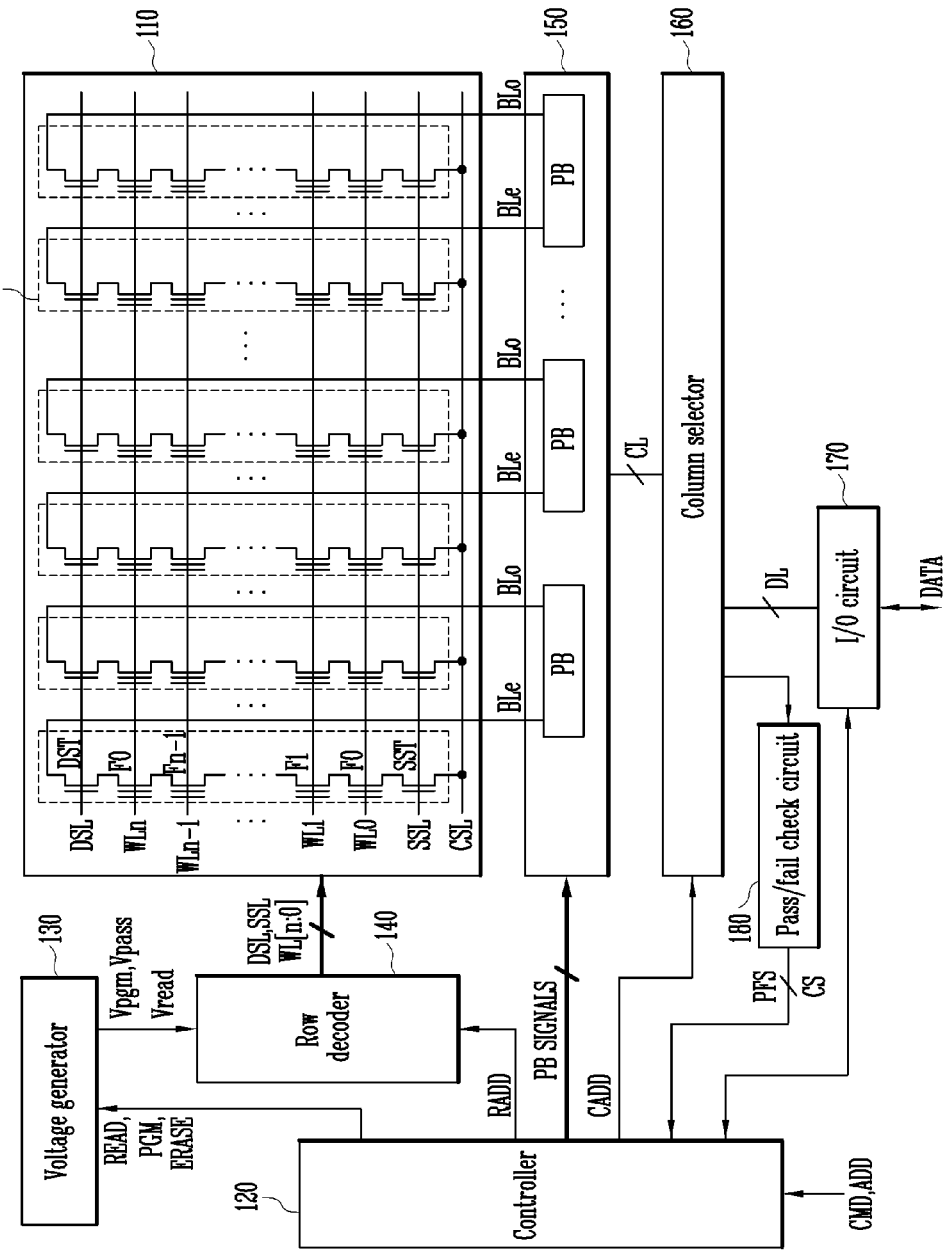
FIG. 2 is a block diagram of a semiconductor device for illustrating some example erase operations of this disclosure.

FIG. 2 is a block diagram of a semiconductor device for illustrating some example erase operations of this disclosure.

Referring to FIG. 2, the semiconductor memory device includes a memory cell array 110, a circuit group configured to perform a program operation or a read operation on the memory cells of the memory cell array 110, and a controller 120 configured to control the circuit group to set the threshold voltages of selected memory cells on the basis of input data.

In a NAND flash memory device, the circuit group includes a voltage generator 130, a row decoder 140, a page buffer group 150, a column selector 160, an I/O circuit 170, and a pass/fail check circuit 180.

The memory cell array 110 includes a plurality of memory blocks. Only one of the memory blocks is shown in FIG. 2. The memory block includes a plurality of strings ST. Some strings ST are designated as normal strings, and some strings ST are designated flag strings. The normal and flag strings ST may have the same construction. Each of the strings ST includes a source select transistor SST coupled to a common source line CSL, a plurality of memory cells F0 to Fn, and a drain select transistor DST coupled to a bit line, for example BLe. Memory cells included in the flag string are called flag cells, but have the same construction as the normal memory cells included in the normal string. The gate of the source select transistor SST is coupled to a source select line SSL, the gates of the memory cells F0 to Fn are coupled to respective word lines WL0 to WLn, and the gate of the drain select transistor DST is coupled to a drain select line DSL. The strings ST are coupled to a bitline from the respective pairs of the bit lines BLe and BLo and are in common coupled to the common source line CSL.

The controller 120 performs control so that an operation of supplying an erase pulse to memory cells is performed, and an erase verify operation of determining whether the threshold voltages of the memory cells have dropped to a target erase voltage is performed through the page buffer group 150. The controller 120 also performs control so that an operation of pre-programming memory cells having the target erase voltage is performed if, as a result of the erase verify operation, memory cells having the threshold voltage dropped to the target erase voltage and memory cells having the threshold voltage not equal to the target erase voltage are mixed. After the pre-program operation, an erase pulse supply operation, the erase verify operation, and the pre-program operation are repeatedly performed until the threshold voltages of all the memory cells drop to the target erase voltage.

The controller 120 generates a program operation signal PGM, a read operation signal READ, or an erase operation signal ERASE in response to command signals CMD, and the controller 120 generates page buffer signals PB SIGNALS for controlling the page buffers of the page buffer group 150 depending on a type of operation to be performed. The controller 120 generates a row address signal RADD and a column address signal CADD in response to address signals ADD. Furthermore, the controller 120 checks whether the threshold voltages of memory cells have risen or dropped to a target voltage in response to a count signal CS generated from the pass/fail check circuit 180, in a program or erase verify operation. The controller 120 determines whether to perform the program or erase operation again, to finish the program or erase operation, or treat the program or erase operation as a pass or a fail depending on the result of the check.

The voltage supply circuit (130 and 140) supplies voltages for the program operation, the erase operation, or the read operation of memory cells, included in a selected memory block, to the drain select line DSL, the word lines WL0 to WLn, and the source select line SSL of the memory cells in response to the signals PGM, ERASE, READ, and RADD. The voltage supply circuit includes the voltage generator 130 and the row decoder 140.

The voltage generator 130 outputs operating voltages necessary to program, read, and erase memory cells to global lines in response to the operating signals PGM, READ, and ERASE, and the voltage generator 130 also outputs operating voltages (e.g., Vpgm, Vpass, and Vread) necessary to program memory cells to the global lines.

The row decoder 140 transfers the operating voltages of the voltage generator 130 to the local lines DSL and SSL, and WL[n:0] of a selected memory block in response to the row address signal RADD.

The page buffer group 150 determines whether memory cells have a program state or an erase state. The page buffer group 150 includes the page buffers PB each coupled to a pair of bit lines BLe and BLo and supplies the bit lines BLe and BLo with respective voltages necessary to store data in the memory cells F0 to Fn in response to the page buffer signals PB SIGNALS.

More specifically, the page buffer group 150 precharges the bit lines BLe and BLo or latches data corresponding to the threshold voltages of the memory cells F0 to Fn detected on the basis of a change in the voltages of the bit lines BLe and BLo, in the program operation, the erase operation, or the read operation of the memory cells F0 to Fn. In other words, in the program operation, the page buffer group 150 supplies a program permission voltage (e.g., 0 V) or a program inhibition voltage (e.g., Vcc) to the bit lines BLe or BLo depending on input data. In the read operation, the page buffer group 150 detects data, stored in the memory cells F0 to Fn, by controlling the voltages of the bit lines BL1 to BLk on the basis of the data stored in the memory cells F0 to Fn. Furthermore, the page buffer group 150 supplies an erase permission voltage (e.g., Vcc) to the bit lines BLe and BLo at an early stage of the erase operation and supplies a program permission voltage (e.g., 0 V) to bit lines coupled to erased strings ST in a program operation performed according to the result of an erase verify operation during the erase operation. The program permission voltage is determined depending on data, stored in the latch of each page buffer, according to the result of the erase verify operation.

The column selector 160 selects the page buffers PB of the page buffer group 150 in response to the column address signal CADD. Data latched in a page buffer selected by the column selector 160 is outputted. The data outputted from the page buffer group 150 may be received through the column line CL and then transferred to the pass/fail check circuit 180.

In a program operation, the I/O circuit 170 transfers external input data DATA to the column selector 160 under control of the controller 120 so that the input data DATA is inputted to the page buffers PB of the page buffer group 150. When the input data DATA is sequentially inputted to the page buffers PB, the page buffers PB store the input data DATA in their internal latches. Furthermore, in a read operation, the I/O circuit 170 externally outputs data DATA, received from the page buffers PB via the column selector 160.

The pass/fail check circuit 180 checks whether error memory cells exist in a verify operation subsequent to a program or erase operation, and the pass/fail check circuit 180 generates the result of the check in the form of a check signal PFS. Furthermore, the pass/fail check circuit 180 counts the number of error memory cells and generates the result of the check in the form of the count signal CS.

The controller 120 controls a program voltage, supplied to a word line coupled to memory cells, in a program operation and controls the voltage generator 130 so that verify voltages are selectively supplied to a word line in a program verify operation. In some embodiments, the controller 120 may control the voltage generator 130 in response to the count signal CS.

Several methods of erasing the memory cells of the semiconductor device are described below with reference to FIGS. 2 to 8. Furthermore, in the following erase methods, it is assumed that the memory block of FIG. 2 is selected.

Figure 3:
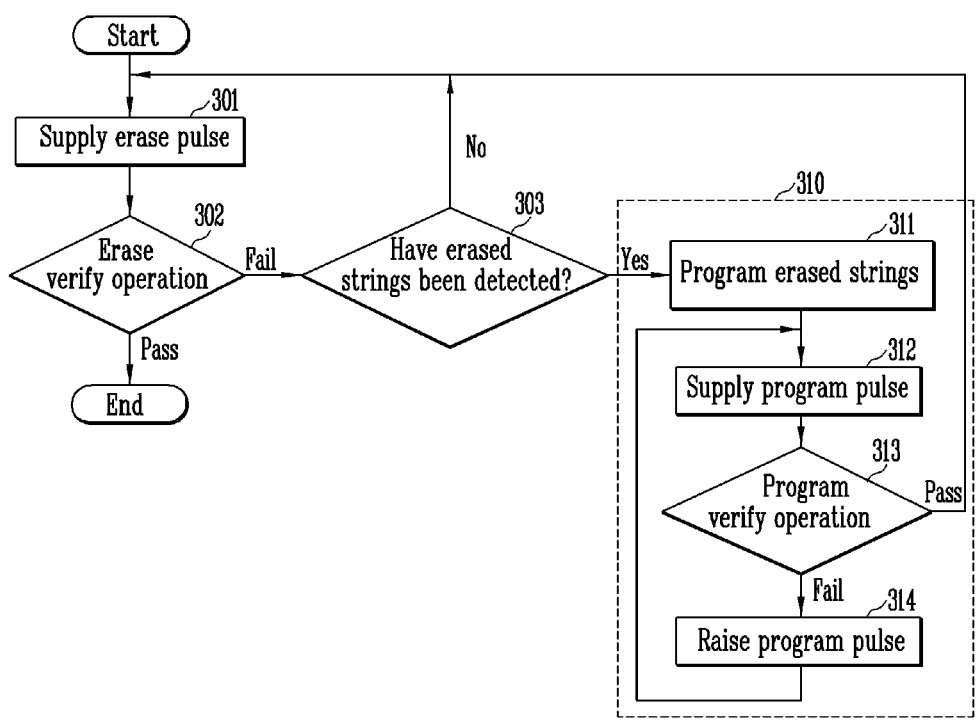
FIG. 3 is a flowchart illustrating an erase method according to a first embodiment of this disclosure.
Figure 8:
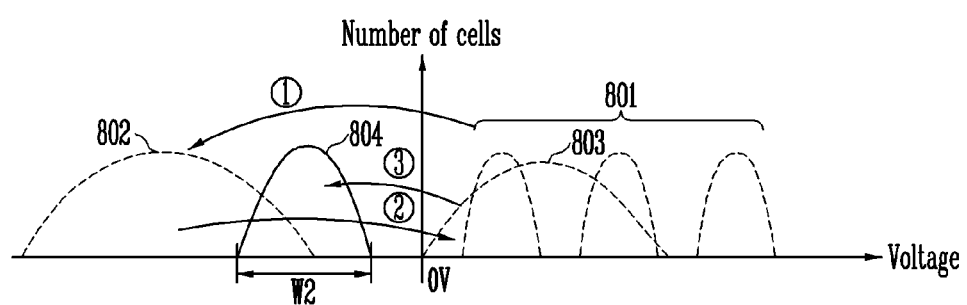
FIG. 8 is a graph illustrating the threshold voltages of memory cells according to the erase operations of this disclosure.

FIG. 3 is a flowchart illustrating an erase method according to a first embodiment of this disclosure, and FIG. 8 is a graph illustrating the threshold voltages of memory cells according to erase operations of this disclosure. The erase method of the semiconductor device is described below with reference to FIGS. 3, and 8.

Erase Pulse Supply Step (301)

Prior to an erase operation, all the memory cells Fn to F0 of the memory block may have been programmed with various threshold voltages (see 801 of FIG. 8), or some of the memory cells might have been erased (see 802 of FIG. 8). In order to erase all the memory cells, all the word lines WL0 to WLn coupled to the memory block are floated or a ground voltage 0 V is supplied to all the word lines and a power source voltage Vcc is supplied to all the bit lines coupled to all the memory cells. Next, the erase operation is performed on all the memory cells by supplying an erase pulse to the well of the memory block (of FIG. 8).

Erase Verify Step (302)

Erase verify operations are simultaneously performed to determine whether the threshold voltages of all the memory cells are lower than an erase reference voltage. In the erase verify operation, data '1' is inputted to latches of page buffers PB used for the erase verify operation, and the bit lines are precharged on the basis of data stored in the latches. That is, if data '1' has been inputted to the latch, the voltage of the input node of the latch has a high level. Thus, the voltages of the bit lines are precharged to a high level by associating the data of the latches of the page buffers with the voltage levels of the bit lines.

Next, a target erase voltage is supplied to all the word lines, and the drain and source select transistors DST and SST coupled to all the memory cells are turned on. Here, the common source line CSL is coupled to the ground terminal. Accordingly, the voltage of a bit line coupled to a string ST including only memory cells having a threshold voltage lower than the target erase voltage is lowered because a current path is formed between the bit line and the ground terminal coupled to the common source line CSL. However, the voltage of a bit line coupled to a string including a memory cell having a threshold voltage higher than the target erase voltage maintains a precharge level because a current path is not formed between the bit line and the ground terminal. Next, it is determined whether the memory cells included in each string have been erased by associating the data of the latches of the page buffers with the voltage levels of the bit lines. More specifically, data stored in the latch of the page buffer coupled to the bit line having the lowered voltage is changed from '1' to '0', but the latch of the page buffer coupled to the bit line maintaining the precharge level maintains data '1'.

After the data of the latches of the page buffers is associated with the voltage levels of the bit lines as described above, if data '1' stored in the latches of all the page buffers are changed into data '0' (i.e., the result of the erase verify operation is determined to be a pass), the erase operation is finished. If there are one or more page buffers in which data '1' is maintained in their latches, the result of the erase verify operation is determined to be a fail.

Step (303) of Detecting Erased Strings

If the result of the erase verify operation is a fail, it is determined whether there is a string including only erased memory cells. If there is no string including only erased memory cells, the erase pulse is supplied at step 301. If a string including only erased memory cells exists, a pre-program operation 310 for lowering a difference between the threshold voltages of all the memory cells included in the memory block is performed.

Step (311) of Programming Erases Strings

First, a program operation is performed on the strings (i.e., erased strings) including only erased memory cells (of FIG. 8). Here, the program operation is called the pre-program operation. That is, if memory cells with a threshold voltage dropped to the target erase voltage and memory cells with a threshold voltage higher than the target erase voltage are mixed in the memory block, the program operation is performed on the memory cells having the threshold voltage dropped to the target erase voltage. The strings including only the erased memory cells and strings including at least one non-erased memory cell may be classified on the basis of data stored in the respective page buffers of the strings. As described above at step 302, data '0' is stored in the latches of the page buffers corresponding to the respective strings including only the erased memory cells, and data '1' remains in the latches of the page buffers corresponding to the respective strings including the non-erased memory cells. Accordingly, when the data stored in the latches of the page buffers is associated with the voltage levels of the bit lines coupled to the page buffers, the program permission voltage 0 V is supplied to the bit lines including '0', and the program inhibition voltage Vcc is supplied to the bit lines including data '1'.

Program Pulse Supply Step (312)

A program pulse is supplied to all the word lines coupled to the memory block. A program operation using the program pulse is performed in accordance with an incremental step pulse program (hereinafter referred to as an 'ISPP') method to prevent the distribution width of the threshold voltages of memory cells from being widened. Thus, the program pulse first supplied to all the word lines has the lowest level of the levels of program pulses according to the ISPP method.

When the program pulse is supplied to all the word lines, memory cells included in strings coupled to bit lines having voltages of a low level are programmed, but memory cells included in strings coupled to bit lines having voltages of a high level are not programmed at step 311. That is, if the program operation is performed on the strings including only the erased memory cells, the threshold voltages of the erased memory cells rise again (see 803 of FIG. 8), so that a difference between the threshold voltages of the non-erased memory cells is reduced.

Program Verify Step (313)

A program verify operation using a program verify voltage is performed on the strings on which the program operation has been performed. The program verify voltage has to only be set higher than the target erase voltage. It is, however, preferred that the program verify voltage be set to 0 V because the present program operation is for reducing a difference between the threshold voltages of the erased memory cells and the threshold voltages of the non-erased memory cells. This reduction in the difference between the threshold voltage of erased and non-erased memory cells may continue until the erase operation is finished. If the result of the program verify operation is a fail, the process proceeds to step 314.

Program Pulse Raise Step (314)

If the result of the program verify operation at step 313 is a fail, the program pulse is raised. It is preferred that the program pulse be raised by a step pulse in the program operation according to the ISPP method. The steps 312 to 314 are repeatedly performed by gradually raising the program pulse until the result of the program verify operation at step 313 is a pass.

If the result of the program verify operation at step 313 is a pass, the steps 301, 302, 303, and 310 are repeatedly performed until the result of the step 302 is a pass. Here, the erase pulse may be maintained at a specific level or may be gradually raised. As the steps 301, 302, 303, and 310 are repeatedly performed (repeat and of FIG. 8), the distribution width of the threshold voltages of all the memory cells included in the memory block is gradually narrowed (see 803 of FIG. 8). This is because the threshold voltages of memory cells programmed with different levels gradually drop near the program verify voltage 0 V and the threshold voltages of memory cells erased lower than the program verify voltage rise so as to approach the program verify voltage.

As the threshold voltages of all the memory cells included in the memory block are gathered near the program verify voltage (see 803 of FIG. 8), a difference between the threshold voltages of all the memory cells is gradually reduced and thus the width of the threshold voltages of all the memory cells is narrowed. If the erase operation is performed in the state in which the distribution width of the threshold voltages has been narrowed as described above (of FIG. 8), the width (see W2 of FIG. 8) in the distribution of the threshold voltages of the erased memory cells is also narrowed (see 804 of FIG. 8).

If the erase and program operations are repeatedly performed as described above, the time taken for the erase operations may be increased, but the time (i.e., 200 msec or lower) increased by additional program operations does not have a great effect on the time taken for the entire program operation because erased memory cells are easily programmed by only a low program voltage. On the contrary, although the time taken for the erase operations is slightly increased, the time taken for actual program operations subsequent to erase operations can be further reduced because the distribution width of the threshold voltages of the erased memory cells is narrowed. Accordingly, the total time taken for the erase and program operations of the semiconductor memory device can be reduced.

Figure 4:
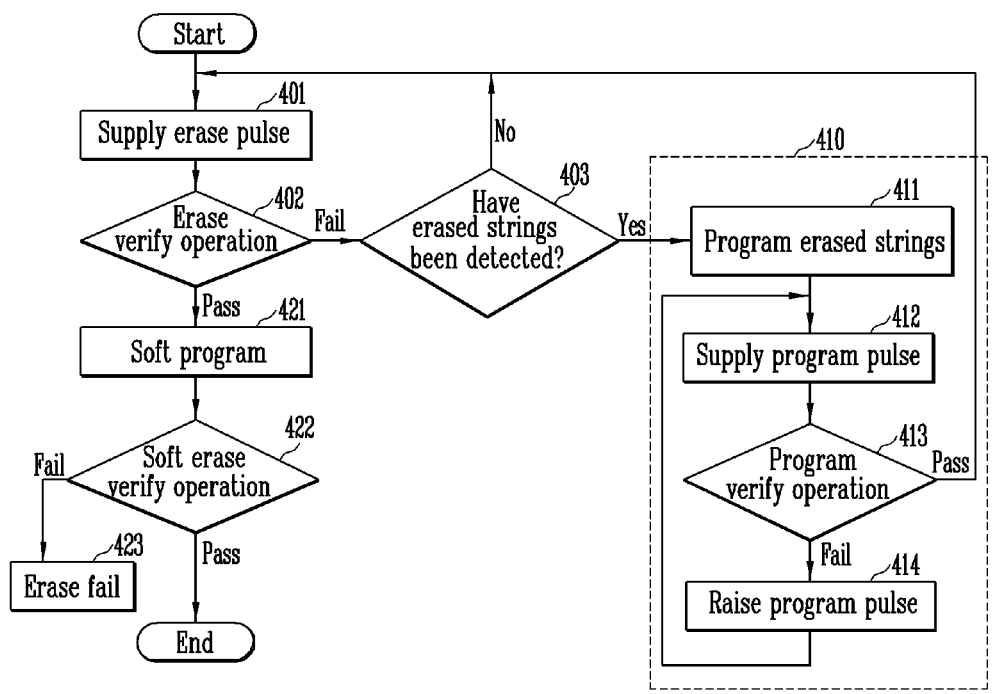
FIG. 4 is a flowchart illustrating an erase method according to a second embodiment of this disclosure.

FIG. 4 is a flowchart illustrating an erase method according to a second embodiment of this disclosure. The erase method of the semiconductor device is described below with reference to FIGS. 4 and 8.

Erase Pulse Supply Step (401)

All the word lines WL0 to WLn coupled to the memory block are supplied the ground voltage 0V or are floated, and the power source voltage Vcc is supplied to all the bit lines of the memory block. Next, an erase operation is performed on the memory cells F0 to Fn coupled to all the word lines, where the erase operation is performed by supplying an erase pulse to the well of the memory block (of FIG. 8).

Erase Verify Step (402)

Erase verify operations are simultaneously performed to determine whether the threshold voltages of all the memory cells are lower than an erase reference voltage. In the erase verify operation, data '1' is inputted to latches of page buffers PB used for the erase verify operation, and the bit lines are precharged on the basis of data stored in the latches. That is, if data '1' has been inputted to the latch, the voltage of the input node of the latch has a high level. If data '0' has been inputted to the latch, the voltage of the input node of the latch has a low level. Accordingly, when the data stored in the latches of the page buffers is associated with the voltage levels of the bit lines, bit lines associated with latches containing data '0' are discharged, and bit lines associated with latched containing data '1' are precharged.

Next, a target erase voltage is supplied to all the word lines, and the drain and source select transistors DST and SST coupled to all the memory cells are turned on. Here, the common source line CSL is coupled to the ground terminal. Accordingly, the voltage of a bit line coupled to a string ST, including only memory cells having a threshold voltage lower than the target erase voltage, is lowered because a current path is formed between the bit line and the ground terminal coupled to the common source line CSL. However, the voltage of a bit line coupled to a string including a memory cell having a threshold voltage higher than the target erase voltage maintains a precharge level because a current path is not formed between the bit line and the ground terminal. Next, it is determined whether the memory cells included in each string have been erased by associating the data of the latches of the page buffers with the voltage levels of the bit lines. More specifically, data stored in the latch of the page buffer coupled to a bit line having the lowered voltage is changed from '1' to '0', but the latch of the page buffer coupled to a bit line maintaining the precharge level maintains data '1'.

After the data of the latches of the page buffers are associated with the voltage levels of the bit lines as described above, if data '1' stored in the latches of all the page buffers are changed into data '0' (i.e., the result of the erase verify operation is determined to be a pass), the process proceeds to step 421. Step 421 is described later.

Step (403) of Detecting Erased Strings

If the result of the erase verify operation at step 402 is a fail, it is determined whether a string including only erased memory cells exists. If there does not exist a string including only erased memory cells, the erase pulse is supplied at step 401. If a string including only erased memory cells exists, a pre-program operation 410 for lowering a difference between the threshold voltages of all the memory cells included in the memory block is performed.

Step (411) of Programming Erased Strings

First, a program operation is performed on the strings (i.e., erased strings) including only erased memory cells (of FIG. 8). The strings including only the erased memory cells and strings including at least one non-erased memory cell may be classified on the basis of data stored in the relevant page buffers of the strings. As described above, at step 402, data '0' is stored in the latches of the page buffers corresponding to the strings including only the erased memory cells, and data '1' remains in the latches of page buffers corresponding to the strings including the non-erased memory cells. At step 403, the strings including only erased memory cells may be detected on the basis of data stored in latches of the page buffers. If the data stored in the latches of the page buffers is associated with the voltage levels of the bit lines coupled to the page buffers, the program permission voltage 0 V is supplied to bit lines including data '0', and the program inhibition voltage Vcc is supplied to the bit lines including data '1'. The program operation is performed only on strings coupled to respective bit lines to which the program permission voltage has been supplied.

Program Pulse Supply Step (412)

A program pulse is supplied to all the word lines coupled to the memory block. A program operation using the program pulse is performed in accordance with an ISPP method to prevent the distribution width of the threshold voltages of memory cells from being widened. Thus, the program pulse first supplied to all the word lines has the lowest level of the levels of program pulses according to the ISPP method.

When the program pulse is supplied to all the word lines, memory cells included in strings coupled to bit lines having voltages of a low level are programmed, but memory cells included in strings coupled to bit lines having voltages of a high level are not programmed at step 411. That is, if the program operation is performed on strings including only erased memory cells, threshold voltages of the erased memory cells rise again, so that a difference between the threshold voltages of the non-erased memory cells is reduced.

Program Verify Step (413)

A program verify operation using a program verify voltage is performed on the strings on which the program operation has been performed. The program verify voltage has to only be set higher than the target erase voltage. It is, however, preferred that the program verify voltage be set to 0 V because the present program operation is for reducing a difference between the threshold voltages of the erased memory cells and the threshold voltages of the non-erased memory cells. This reduction in the difference between the threshold voltage of erased and non-erased memory cells may continue until the erase operation is finished. If the result of the program verify operation is a pass, the process returns to step 401. If the result of the program verify operation is a fail, the process proceeds to step 414.

Step (414) of Raising Program Pulse

If the result of the program verify operation at step 413 is a fail, the program pulse is raised. It is preferred that the program pulse be raised by a step pulse in the program operation according to the ISPP method. The steps 412 to 414 are repeatedly performed by gradually raising the program pulse until the result of the program verify operation at step 413 is a pass.

If the result of the program verify operation at step 413 is a pass, the steps 401, 402, 403, and 410 are repeatedly performed until the result of the step 402 is a pass. As the steps 401, 402, 403, and 410 are repeatedly performed, the distribution width of the threshold voltages of all the memory cells included in the memory block is gradually narrowed. This is because the threshold voltages of memory cells programmed with different levels gradually drop near the program verify voltage 0 V and the threshold voltages of memory cells erased lower than the program verify voltage rise so as to approach the program verify voltage. As the threshold voltages of all the memory cells included in the memory block are gathered near the program verify voltage (see 803 of FIG. 8), a difference between the threshold voltages of all the memory cells is gradually reduced and thus the distribution width of the threshold voltages of all the memory cells is narrowed. If the erase operation is performed in the state in which the distribution width of the threshold voltages has been narrowed as described above (of FIG. 8), the distribution width of the threshold voltages of the erased memory cells is also narrowed (see 804 of FIG. 8).

Soft Program Step (421)

A soft program operation is performed on all the memory cells of the erased memory block. The soft program operation is performed to further narrow the distribution width of the threshold voltages of the memory cells while raising the threshold voltages of the memory cells by a specific level. The soft program operation may be performed by supplying a program pulse in accordance with an ISPP method. More specifically, the soft program operation is performed by supplying the program permission voltage 0 V to all the bit lines and then supplying a program pulse to all the word lines. After the program pulse is supplied, a soft program verify operation using a target soft program voltage is performed to verify the threshold voltages of the programmed memory cells. The target soft program voltage is set to be lower than 0 V, but is set to be higher than the target erase voltage. The soft program operation and the soft program verify operation are repeatedly performed until the threshold voltages of all the memory cells reach the target soft program voltage.

Soft Erase Verify Stein (422)

If the result of the soft program verify operation is a pass at step 421, a soft erase verify operation is performed on all the memory cells to detect excessively soft-programmed memory cells. That is, in the soft program operation at step 421, if the threshold voltages of the memory cells only have to reach the target soft program voltage, the memory cells are treated as a pass, thereby making it difficult to know how much the threshold voltages have risen. Thus, an excessively soft-programmed memory cell may exist. In the soft erase verify operation, the highest voltage—of voltages defined as erase states—is set as the target soft erase voltage. If, as a result of the soft erase verify operation, memory cells having threshold voltages each equal to the target soft erase voltage are not detected, the erase operation for the memory block is treated as a pass and the erase operation is then finished. If, as a result of the soft erase verify operation, a memory cell having a threshold voltage dropped to the target soft erase voltage is detected, the erase operation for the memory block is treated as a fail at step 423.

If the steps 401, 402, 403, and 410 are repeatedly performed as described above, the distribution width of the threshold voltages of all the memory cells can be narrowed. Furthermore, the distribution width of the threshold voltages of the memory cells can be further narrowed because a low threshold voltage can be raised by performing the step 421. Furthermore, the reliability of the semiconductor memory device can be further improved because excessively soft-programmed memory cells can be detected through the step 422.

Figure 5:
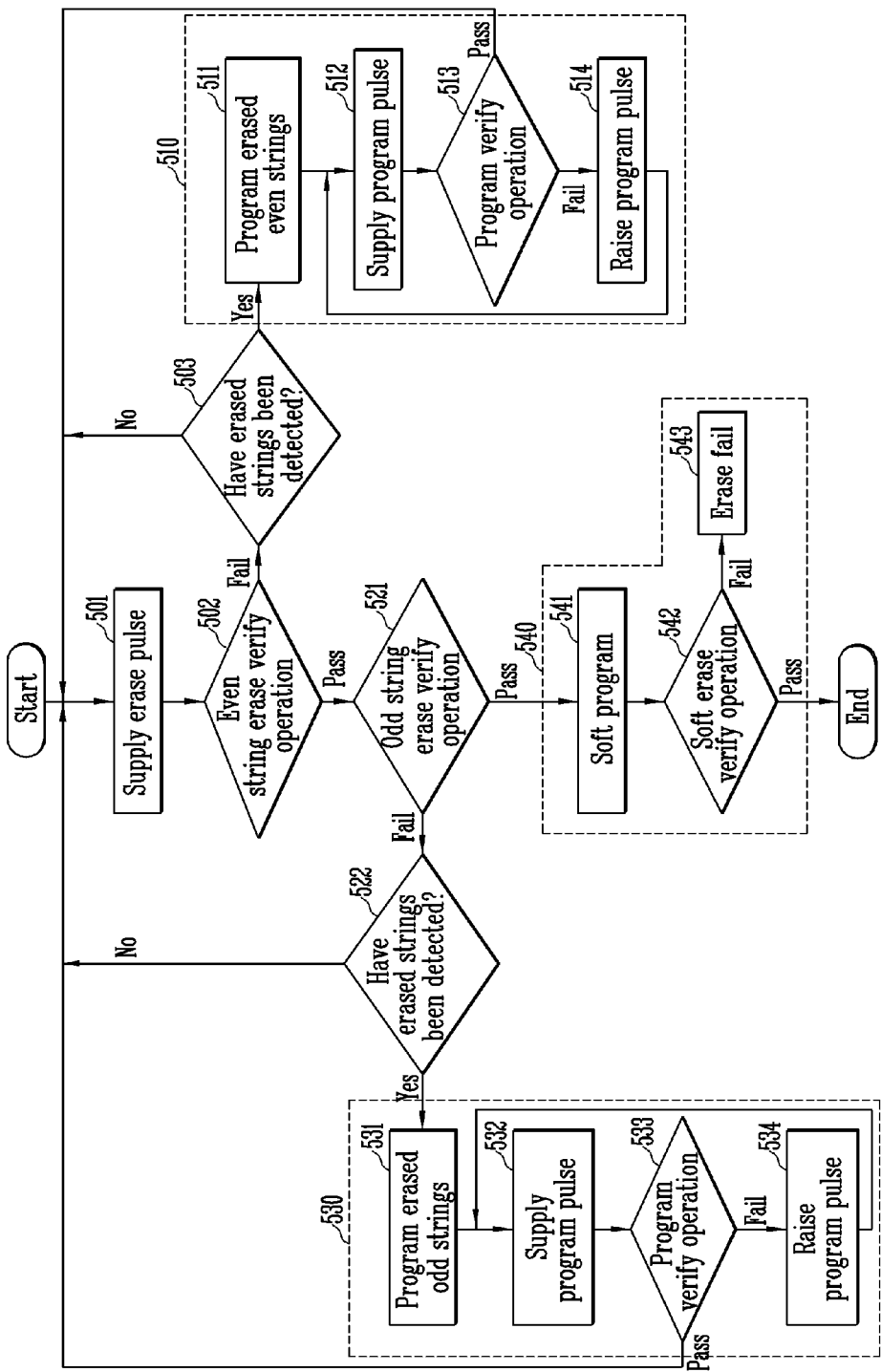
FIG. 5 is a flowchart illustrating an erase method according to a third embodiment of this disclosure.

FIG. 5 is a flowchart illustrating an erase method according to a third embodiment of this disclosure.

Erase Pulse Supply Step (501)

All the word lines WL0 to WLn coupled to the memory block are floated or supplied the ground voltage 0 V, and the power source voltage Vcc is supplied to all the bit lines of the memory block. Next, an erase operation is performed on the memory cells F0 to Fn coupled to all the word lines by supplying an erase pulse to the well of the memory block (of FIG. 8).

Even String Erase Verify Step (502)

It is assumed that an even and an odd bit line are coupled to a page buffer (i.e., two bit lines are coupled to a page buffer). An erase verify operation is performed on any one of an even or odd string coupled to respective even and odd bit lines. In this disclosure, an example in which the erase verify operation is first performed on a group of the even strings is described below. The erase verify operation is performed to verify whether the threshold voltages of memory cells included in the even strings (hereinafter referred to as 'even memory cells') are lower than an erase reference voltage. In the erase verify operation, data '1' is inputted to latches used for the erase verify operation and the even bit lines coupled to the respective even strings are precharged on the basis of data stored in the latches. That is, if data '1' has been inputted to a latch of a page buffer, the voltage of an even bit line is precharged to a high level by associating the data of the latch with the voltage level of the bit line because the voltage of the input node of the latch has a high level.

Next, a target erase voltage is supplied to all the word lines, and the drain and source select transistors DST and SST coupled to all the even memory cells are turned on. Here, the common source line CSL is coupled to the ground terminal. Accordingly, the voltage of an even bit line coupled to an even string including only even memory cells having a threshold voltage lower than the target erase voltage is lowered because a current path is formed between the even bit line and the ground terminal coupled to the common source line CSL. However, the voltage of an even bit line coupled to an even string including an even memory cell having a threshold voltage higher than the target erase voltage maintains a precharge level because a current path is not formed between the even bit line and the ground terminal. Next, it is determined whether the even memory cells included in each even string have been erased by associating the data of the latches of the page buffers with the voltage levels of the bit lines. More specifically, the data stored in the latches of the page buffers coupled to the even bit lines having lowered voltages is changed from '1' to '0', but the latches of page buffers coupled to the even bit lines maintaining the precharge level maintain data '1'.

After the data of the latches of the page buffers is associated with the voltage levels of the bit lines as described above, if data '1' stored in the latches of all the page buffers is changed into data '0' (i.e., the result of the erase verify operation is determined to be a pass), the process proceeds to step 521. The step 521 is described later.

Step (503) of Detecting Erased Strings

If the erase verify operation at step 502 fails, it is determined on the basis of data stored in the page buffers whether an even string including only erased even memory cells exists. If, as result of the determination, an even string including only erased memory cells does not exist, the process returns to step 501. If an even string including only erased memory cells exists, a pre-program operation 510 for lowering a difference between the threshold voltages of all the even memory cells included in the memory block is performed.

Step (511) of Programming Erased Even Strings

First, a program operation is performed on the even strings (i.e., erased even strings) including only the erased even memory cells. The even strings including only erased even memory cells and even strings including at least one non-erased even memory cell, may be classified on the basis of data stored in latches of the relevant page buffers. As described above, at step 502, data '0' is stored in the page buffers corresponding to the even strings including only erased even memory cells, and data '1' is stored in the page buffers corresponding to the even strings including at least one non-erased even memory cell. At step 503, the even strings including only erased even memory cells can be detected on the basis of the data stored in latches of the page buffers, and the pre-program operation can also be performed. If the data stored in the latch of a page buffer associated with an even bit line is '0', the program permission voltage 0 V is supplied to the even bit line. If the data stored in the latch of a page buffer associated with an even bit line is '1', the program inhibition voltage Vcc is supplied to the even bit line.

Program Pulse Supply Step (512)

A program pulse is supplied to all the word lines coupled to the memory block. A program operation using the program pulses is performed in accordance with an ISPP method to prevent the distribution width of the threshold voltages of even memory cells from being widened. Thus, the program pulse first supplied to all the word lines has the lowest level of the levels of the program pulses according to the ISPP method.

When the program pulse is supplied to all the word lines, even memory cells included in even strings coupled to respective even bit lines having voltages of a low level are programmed, but even memory cells included in even strings coupled to respective even bit lines having voltages of a high level are not programmed at step 511. That is, if the program operation is performed on the even strings including only the erased even memory cells, the threshold voltages of the erased even memory cells rise again, so that a difference between the threshold voltages of the non-erased even memory cells is reduced.

Program Verify Step (513)

A program verify operation using a program verify voltage is performed on the even strings on which the program operation has been performed. The program verify voltage has only to be set higher than the target erase voltage. It is, however, preferred that the program verify voltage be set to 0 V because the present program operation is for reducing a difference between the threshold voltages of the erased even memory cells and the threshold voltages of the non-erased even memory cells. This reduction in the difference between the threshold voltage of erased and non-erased memory cells may continue until the erase operation is finished. If the result of the program verify operation is a pss, the process returns to step 501. If the result of the program verify operation is a fail, the process proceeds to step 514.

Step (514) of Raising Program Pulse

If the result of the program verify operation at step 513 is determined to be a fail, the program pulse is raised. It is preferred that the program pulse be raised by a step pulse in the program operation according to the ISPP method. The steps 512 to 514 are repeatedly performed by gradually raising the program pulse until the result of the program verify operation at step 513 is a pass.

If the result of the program verify operation at step 513 is a pass, the steps 501, 502, 503, and 510 are repeatedly performed until the result of the step 502 is a pass. As the steps 501, 502, 503, and 510 are repeatedly performed, the distribution width of the threshold voltages of all the even memory cells included in the memory block is gradually narrowed. This is because the threshold voltages of even memory cells programmed with different levels gradually drop so as to approach the program verify voltage 0 V and the threshold voltages of even memory cells erased lower than the program verify voltage rise so as to approach the program verify voltage. As the threshold voltages of all the even memory cells included in the memory block are gathered near the program verify voltage, a difference between the threshold voltages of all the even memory cells is gradually reduced and thus the distribution width of the threshold voltages of all the even memory cells is narrowed. If the erase operation is performed in a state in which the distribution width of the threshold voltages has been narrowed as described above, the distribution width of the threshold voltages of the erased even memory cells is also narrowed.

Odd String Erase Verify Step (521)

An erase verify operation is performed to verify whether the threshold voltages of memory cells included in the odd strings (hereinafter referred to as 'odd memory cells') are lower than the erase reference voltage. In the erase verify operation, data '1' is inputted to latches used for the erase verify operation, from among the latches of all the page buffers coupled to the odd strings, and the odd bit lines coupled to the odd strings are precharged on the basis of data stored in the latches. That is, if data '1' has been inputted to a latch of a page buffer, the voltages of the odd bit lines are precharged to a high level by associating the data of the latches of the page buffer with the voltage levels of the odd bit lines because the voltages of the input nodes of the latches have a high level.

Next, a target erase voltage is supplied to all the word lines coupled to the memory block, and the drain and source select transistors DST and SST coupled to all the odd memory cells are turned on. Here, the common source line CSL is coupled to the ground terminal. Accordingly, the voltage of an odd bit line (from among all the odd bit lines) coupled to an odd string including only odd memory cells having a threshold voltage lower than the target erase voltage is lowered because a current path is formed between the odd bit line and the ground terminal coupled to the common source line CSL. However, the voltage of an odd bit line (from among all the odd bit lines) coupled to an odd string including at least one odd memory cell having a threshold voltage higher than the target erase voltage maintains a precharge level because a current path is not formed between the odd bit line and the ground terminal. Next, it is determined whether the odd memory cells included in each odd string have been erased by associating the data of the latches of all the page buffers with the voltage levels of all the odd bit lines. More specifically, data stored in the latch of a page buffer coupled to an odd bit line having a lowered voltage is changed from '1' to '0', but the latch of a page buffer coupled to the odd bit line maintaining the precharge level maintains data '1'.

After the data stored in the latches of all the page buffers is associated with the voltage levels of all the odd bit lines as described above, if data '1' stored in the latches of all the page buffers is changed into data '0' (i.e., the result of the erase verify operation for the odd strings is determined to be a pass), the process proceeds to step 540. The step 540 is described later.

Step (522) of Detecting Erased Strings

If the erase verify operation at step 521 fails, it is determined on the basis of data stored in the page buffers whether an odd string including only erased odd memory cells exists. If an odd string including only erased odd memory cells does not exist, the process returns to step 501. If an odd string including only erased odd memory cells exists, a pre-program operation 530 for lowering a difference between the threshold voltages of all the odd memory cells included in the memory block is performed.

Step (531) of Programming Erased Odd Strings

First, a program operation is performed on the odd strings (i.e., erased odd strings) including only the erased odd memory cells. The odd strings including only erased odd memory cells, and odd strings including at least one non-erased odd memory cell, may be classified on the basis of data stored in latches of the relevant page buffers. As described above, at step 521, data '0' is stored in page buffers corresponding to odd strings including only erased odd memory cells, and data '1' is stored in page buffers corresponding to odd strings including at least one non-erased odd memory cell. Accordingly, when the data stored in the latches of the page buffers is associated with the odd bit lines coupled to the page buffers, the program permission voltage 0 V is supplied to odd bit lines including data '0', and the program inhibition voltage Vcc is supplied to the odd bit lines including data '1'.

Program Pulse Supply Step (532)

A program pulse is first supplied to all the word lines coupled to the memory block. A program operation using the program pulses is performed in accordance with an ISPP method to prevent the distribution width of the threshold voltages of odd memory cells from being widened. Thus, the program pulse first supplied to all the word lines has the lowest level of the levels of the program pulses according to the ISPP method.

When the program pulse is supplied to all the word lines, odd memory cells included in odd strings coupled to odd bit lines having voltages of a low level are programmed, but odd memory cells included in odd strings coupled to odd bit lines having voltages of a high level are not programmed at step 531. That is, if the program operation is performed on the odd strings including only the erased odd memory cells, the threshold voltages of the erased odd memory cells rise again, so that a difference between the threshold voltages of the non-erased odd memory cells is reduced.

Program Verify Step (533)

A program verify operation using a program verify voltage is performed on the odd strings on which the program operation has been performed. The program verify voltage has only to be set higher than the target erase voltage. It is, however, preferred that the program verify voltage be set to 0 V because the present program operation is for reducing a difference between the threshold voltages of the erased odd memory cells and the threshold voltages of the non-erased odd memory cells until the erase operation is finished. If the result of the program verify operation is determined to be a pass, the process returns to step 501. If the result of the program verify operation is determined to be a fail, the process proceeds to step 534.

Step (534) of Raising Program Pulse

If the result of the program verify operation at step 533 is a fail, the program pulse is raised. It is preferred that the program pulse be raised by a step pulse in the program operation according to the ISPP method. The steps 532 to 534 are repeatedly performed by gradually raising the program pulse until the result of the program verify operation at step 533 is a pass.

If the result of the program verify operation at step 533 is a pass, the steps 501, 502, 521, 522, and 530 are repeatedly performed until the result of the step 521 is a pass. Here, the step 502 directly proceeds to step 521 because the result of the erase verify operation for all the even memory cells is a pass. As the steps 501, 502, 521, 522, and 530 are repeatedly performed, the distribution width of the threshold voltages of all the odd memory cells included in the memory block is gradually narrowed. This is because the threshold voltages of odd memory cells programmed with different levels gradually drop so as to approach the program verify voltage 0 V and the threshold voltages of odd memory cells erased lower than the program verify voltage rise so as to approach the program verify voltage. As the threshold voltages of all the odd memory cells included in the memory block are gathered near the program verify voltage, a difference between the threshold voltages of all the odd memory cells is gradually reduced and thus the distribution width of the threshold voltages of all the odd memory cells is narrowed. If the erase operation is performed in the state in which the distribution width of the threshold voltages has been narrowed as described above, the distribution width of the threshold voltages of the erased odd memory cells is also narrowed.

If the result of the erase verify operation for the odd strings at step 521 is a pass, the erase operation of the memory block is finished, or a soft program and erase verify operation 540 may be further performed to further narrow the distribution width of the threshold voltages of the memory cells. The soft program and erase verify operation 540 is performed as follows.

Soft Program Step (541)

A soft program operation is performed on all the erased memory cells included in the erased memory block. The soft program operation is performed to further narrow the distribution width of the threshold voltages of the erased memory cells while raising the threshold voltages of the erased memory cells by a specific level. The soft program operation may be performed in accordance with an ISPP method. More specifically, the soft program operation may be performed as in the step 421 of FIG. 4 and may be performed by dividing the erased memory cells into even memory cells and odd memory cells.

Soft Erase Verify Step (542)

If the result of the soft program verify operation at step 541 is a pass, a soft erase verify operation is performed on all the memory cells to verify whether there is a memory cell having a threshold voltage higher than the highest level defined as an erase state. That is, in the soft program operation at step 541, if the threshold voltages of the memory cells have to only reach the target soft program voltage, the memory cells are treated as a pass, thereby making it difficult to know how much the threshold voltages have risen. That is, excessively soft-programmed cells may exist. In the soft erase verify operation, the highest voltage of voltages defined as erase states is set as the target soft erase voltage. If, as a result of the soft erase verify operation, memory cells having threshold voltages each equal to the target soft erase voltage are not detected, the erase operation for the memory block is treated as a pass and the erase operation is then finished. If, as a result of the soft erase verify operation, a memory cell having a threshold voltage dropped to the target soft erase voltage is detected, the erase operation for the memory block is treated as a fail at step 543.

If the steps 501, 502, 503, 510, 521, 522, and 530 are repeatedly performed as described above, the distribution width of the threshold voltages of the even and odd memory cells can be narrowed. Furthermore, the distribution width of the threshold voltages of the memory cells can be further narrowed because a low threshold voltage can be raised by performing the step 541. Furthermore, the reliability of the semiconductor memory device can be further improved because excessively soft-programmed memory cells can be detected through the step 542.

Figure 6:
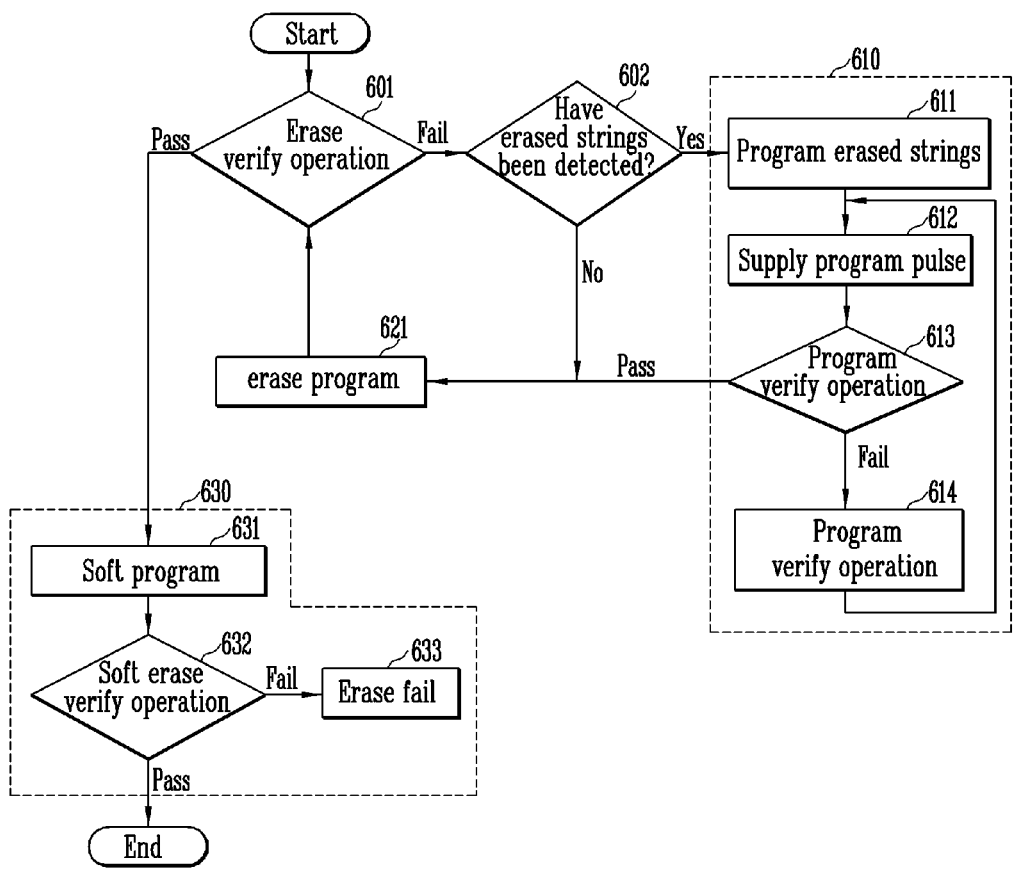
FIG. 6 is a flowchart illustrating an erase method according to a fourth embodiment of this disclosure.

FIG. 6 is a flowchart illustrating an erase method according to a fourth embodiment of this disclosure.

Erase Verify Stein (601)

When an erase operation is started, an erase verify operation is performed before an erase pulse is supplied to the well of the memory block. Prior to the erase operation, some of the memory cells F0 to Fn of the memory block might have been programmed in various levels, and some thereof may have an erase state. In order to reduce the number of operations of supplying the erase pulse, all the strings ST included in the memory block are divided into erased strings and non-erased strings by performing the erase verify operation before the erase pulse is supplied.

More specifically, in the erase verify operation, data '1' is inputted to latches of page buffers used for the erase verify operation and the bit lines coupled to the relevant page buffers are precharged on the basis of data stored in the latches. That is, if data '1' has been inputted to the latch, the voltage of the input node of the latch has a high level. Accordingly, when the data stored in the latches of the page buffers are associated with the voltage levels of the bit lines, the voltages of the bit lines are precharged to a high level.

Next, a target erase voltage is supplied to all the word lines WL0 to WLn, and the drain and source select transistors DST and SST coupled to all the memory cells are turned on. Here, the common source line CSL is coupled to the ground terminal. Accordingly, the voltage of a bit line coupled to a string, including only memory cells having a threshold voltage lower than the target erase voltage, is lowered because a current path is formed between the bit line and the ground terminal coupled to the common source line CSL. However, the voltage of a bit line coupled to a string including a memory cell having a threshold voltage higher than the target erase voltage maintains a precharge level because a current path is not formed between the bit line and the ground terminal. Next, it is determined whether the memory cells included in each string have been erased by associating the data of the latches of the page buffers with the voltage levels of the bit lines. More specifically, data stored in the latch of the page buffer coupled to the bit line having the lowered voltage is changed from '1' to '0', but the latch of the page buffer coupled to the bit line maintaining the precharge level maintains data '1'.

After the data stored in the latches of the page buffers is associated with the voltage levels of the bit lines as described above, if data '1' stored in the latches of all the page buffer are changed into data '0' (i.e., the result of the erase verify operation is determined to be a pass), the erase operation is finished. If at least one page buffer maintaining data '1' exists in the page buffers, the result of the erase verify operation is determined to be a fail.

Step (602) of Detecting Erased Strings

If the result of the erase verify operation at step 601 is a fail, it is determined whether a string including only erased memory cells exists on the basis of data stored in the latches of the page buffers. If a string including only erased memory cells does not exist, an erase pulse is supplied at step 621. If a string including only erased memory cells exists, a pre-program operation 610 of lowering a difference between the threshold voltages of all the memory cells included in the memory block is performed.

The pre-program operation includes a step 611 of programming erased strings, a program pulse supply step 612, a program verify step 613, and a step 614 of raising a program pulse.

Step (611) of Programming Erased Strings

First, a program operation is performed on the strings (i.e., erased strings) including only erased memory cells. The strings including only the erased memory cells and strings including at least one non-erased memory cell may be classified on the basis of data stored in the relevant page buffers of the memory strings. As described above, at step 601, data '0' is stored in the page buffers corresponding to the strings including only erased memory cells, and data '1' remains in the latches of page buffers corresponding to strings including non-erased memory cells. Accordingly, if the data stored in the latches of the page buffers is associated with the voltage levels of the bit lines coupled to the page buffers, the program permission voltage 0 V is supplied to bit lines including data '0', and the program inhibition voltage Vcc is supplied to the bit lines including data '1'.

Program Pulse Supply Step (612)

A program pulse is supplied to all the word lines coupled to the memory block. A program operation using the program pulse is performed in accordance with an ISPP method to prevent the distribution width of the threshold voltages of memory cells from being widened. Thus, the program pulse first supplied to all the word lines has the lowest level of the levels of program pulses according to the ISPP method.

When the program pulse is supplied to all the word lines, memory cells included in strings coupled to bit lines having voltages of a low level are programmed, but memory cells included in strings coupled to bit lines having voltages of a high level are not programmed at step 611. That is, if the program operation is performed on strings including only erased memory cells, threshold voltages of the erased memory cells rise again, so that a difference between the threshold voltages of the non-erased memory cells is reduced.

Program Verify Step (613)

A program verify operation using a program verify voltage is performed on the strings on which the program operation has been performed. The program verify voltage has to only be set higher than the target erase voltage. It is, however, preferred that the program verify voltage be set to 0 V because the present program operation is for reducing a difference between the threshold voltages of the erased memory cells and the threshold voltages of the non-erased memory cells. This reduction in the difference between the threshold voltage of erased and non-erased memory cells may continue until the erase operation is finished. If the result of the program verify operation is a pass, the process proceeds to step 621 of supplying the erase pulse to the well of the memory block. If the result of the program verify operation is a fail, the process proceeds to step 614 of raising the program pulse. The step 614 is described in detail below.

Step (614) of Raising Program Pulse

If the result of the program verify operation at step 613 is a fail, the program pulse is raised. It is preferred that the program pulse be raised by a step pulse in the program operation according to the ISPP method. The steps 612 to 614 are repeatedly performed by gradually raising the program pulse until the result of the program verify operation at step 613 is a pass.

Erase Pulse Supply Step (621)

If the result of the program verify operation at step 613 is a pass, all the memory cells of the memory block are erased. More specifically, all the word lines coupled to the memory block are floated or the ground voltage 0 V is supplied to all the word lines and the power source voltage Vcc is supplied to all the bit lines of the memory block. Next, all the memory cells coupled to all the word lines are erased by supplying an erase pulse to the well of the memory block.

After the erase pulse is supplied to the memory block, the erase verify operation 601 for the erase operation 621 is performed. Likewise, the steps 601, 610, and 621 are repeatedly performed until the result of the erase verify operation for the memory block is a pass.

The erase pulse may maintain a specific level whenever the steps 601, 602, 610, and 621 are repeatedly performed, or the erase pulse may be gradually raised when the erase operation is performed in accordance with an incremental step pulse erase (ISPE) method.

As the steps 601, 602, 610, and 621 are repeatedly performed, the distribution width of the threshold voltages of all the memory cells included in the memory block is gradually narrowed. This is because the threshold voltages of memory cells programmed with different levels gradually drop so as to approach the program verify voltage 0 V, and the threshold voltages of memory cells erased lower than the program verify voltage rise so as to approach the program verify voltage. As the threshold voltages of all the memory cells included in the memory block are gathered near the program verify voltage, a difference between the threshold voltages of all the memory cells is gradually reduced and thus the distribution width of the threshold voltages of all the memory cells is narrowed. If the erase operation is performed in the state in which the distribution width of the threshold voltages has been narrowed as described above, the distribution width of the threshold voltages of the erased memory cells is also narrowed.

If the result of the erase verify operation for the memory block at step 601 is a pass, the erase operation of the memory block is finished, otherwise a soft program and erase verify operation 630 may be further performed to narrow the distribution width of the threshold voltages of the memory cells included in the memory block.

Soft Program Step (631)

A soft program operation is performed on all the memory cells of the erased memory block. The soft program operation is performed to further narrow the distribution width of the threshold voltages of the memory cells while raising the threshold voltages of the memory cells by a specific level. The soft program operation may be performed by supplying a program pulse in accordance with an ISPP method. More specifically, the soft program operation is performed by supplying the program permission voltage 0 V to all the bit lines and then supplying a program pulse to all the word lines. After the program pulse is supplied, a soft program verify operation using a target soft program voltage is performed to verify the threshold voltages of the programmed memory cells. The target soft program voltage is set to be lower than 0 V, but is set to be higher than the target erase voltage. The soft program operation and the soft program verify operation are repeatedly performed until the threshold voltages of all the memory cells reach the target soft program voltage.

Soft Erase Verify Step (632)

If the result of the soft program verify operation is a pass at step 601, a soft erase verify operation is performed in all the memory cells of the memory block to verify whether a memory cell having a threshold voltage higher than the highest level defined as an erase state exists. That is, in the soft program operation at step 631, if the threshold voltages of the memory cells only have to reach the target soft program voltage, the memory cells are treated as a pass, thereby making it difficult to know how much the threshold voltages have risen. That is, an excessively soft-programmed memory cell may exist. In the soft erase verify operation the highest voltage—of voltages defined as erase states—is set as the target soft erase voltage. If, as a result of the soft erase verify operation, memory cells having threshold voltages each equal to the target soft erase voltage are not detected, the erase operation for the memory block is treated as a pass and the erase operation is then finished. If, as a result of the soft erase verify operation, there is a memory cell having a threshold voltage dropped to the target soft erase voltage, the erase operation for the memory block is treated as a fail at step 633.

If the steps 601, 602, 610, and 621 are repeatedly performed as described above, the distribution width of the threshold voltages of all the memory cells can be narrowed. Furthermore, the distribution width of the threshold voltages of the memory cells can be further narrowed because a low threshold voltage can be raised by performing the step 631. Furthermore, the reliability of the semiconductor memory device can be further improved because excessively soft-programmed memory cells can be detected through the step 632.

Figure 7:
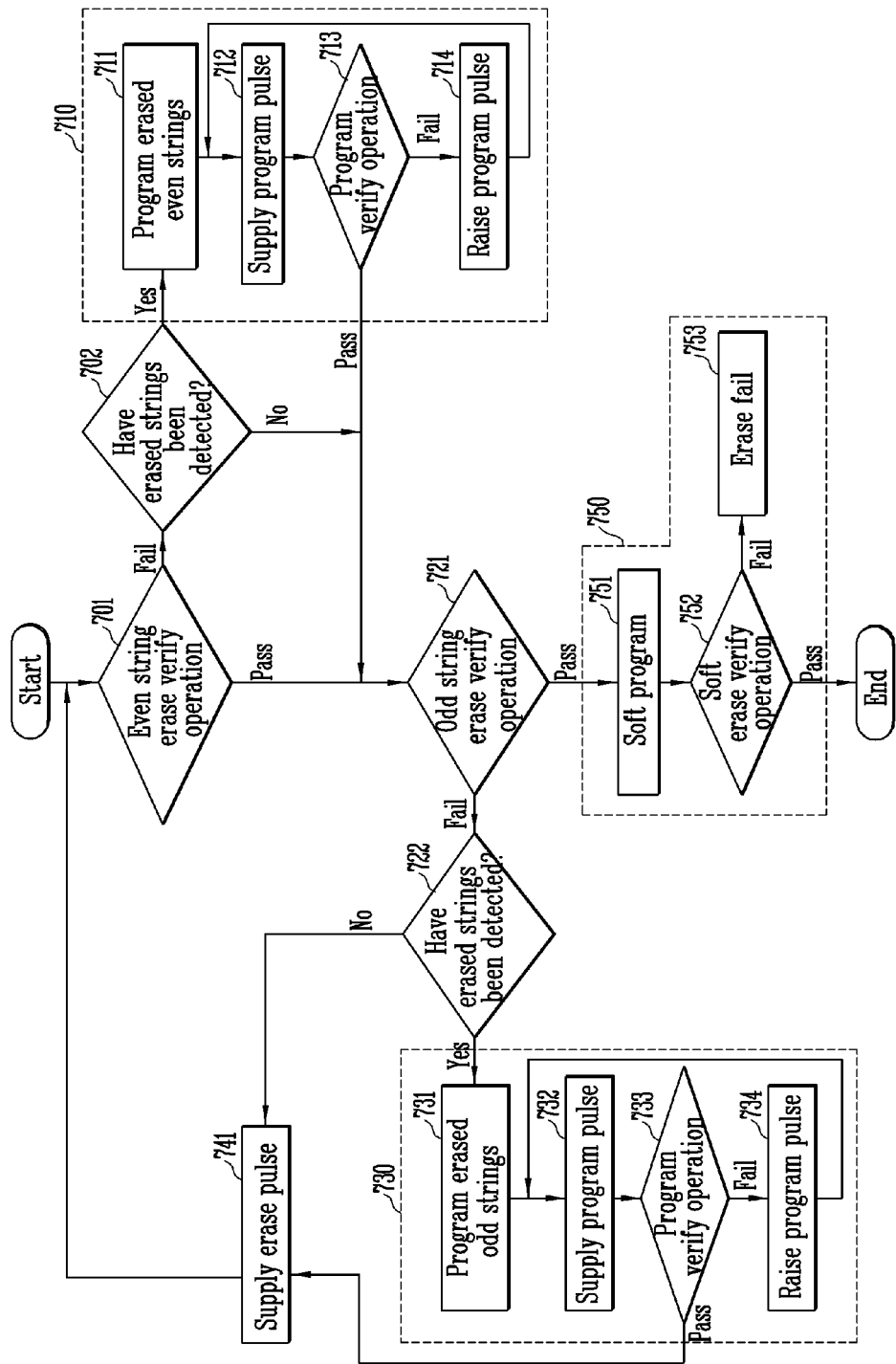
FIG. 7 is a flowchart illustrating an erase method according to a fifth embodiment of this disclosure.

FIG. 7 is a flowchart illustrating an erase method according to a fifth embodiment of this disclosure.

Even String Erase Verify Step (701)

When an erase operation is started, an erase verify operation is performed before an erase pulse is supplied to the well of the memory block. Prior to the erase operation, some of all the memory cells Fn to Fn of the memory block might have been programmed to various levels, and some thereof may have an erase state. In order to reduce the number of operations for supplying the erase pulse, all the strings ST included in the memory block are divided into erased strings and non-erased strings by performing the erase verify operation before the erase pulse is supplied.

The erase verify step is described in detail below.

It is assumed that an even and odd bit line are coupled to a page buffer (i.e., two bit lines are coupled to a page buffer). An erase verify operation is performed on any one of an even or odd string coupled to a respective even and odd bit line. In this disclosure, an example in which the erase verify operation is first performed on a group of the even strings is described below. The erase verify operation is performed to verify whether the threshold voltages of memory cells included in the even strings (hereinafter referred to as 'even memory cells') are lower than an erase reference voltage. In the erase verify operation, data '1' is inputted to latches (from among the latches of all the page buffers) used for the erase verify operation, and the even bit lines coupled to the respective even strings are precharged on the basis of data stored in the latches. That is, if data '1' has been inputted to the latches, the voltages of the even bit lines are precharged to a high level by associating the data of the latches with the voltage levels of the even bit lines because the voltage of the input nodes of the latches have a high level.

Next, a target erase voltage is supplied to all the word lines WL0 to WLn, and the drain and source select transistors DST and SST coupled to all the even memory cells are turned on. Here, the common source line CSL is coupled to the ground terminal. Accordingly, the voltage of an even bit line coupled to an even string including only even memory cells each having a threshold voltage lower than the target erase voltage is lowered because a current path is formed between the even bit line and the ground terminal coupled to the common source line CSL. However, the voltage of an even bit line coupled to an even string including an even memory cell having a threshold voltage higher than the target erase voltage maintains a precharge level because a current path is not formed between the even bit line and the ground terminal. Next, it is determined whether the even memory cells included in each even string have been erased by associating the data of the latches of all the page buffers with the voltage levels of all the even bit lines. More specifically, data stored in the latch of a page buffer coupled to an even bit line having a lowered voltage is changed from '1' to '0', but the latch of the page buffer coupled to the even bit line maintaining the precharge level maintains data '1'.

After the data of the latches of the page buffers is associated with the voltage levels of the even bit lines as described above, if data '1' stored in the latches of all the page buffers is changed into data '0' (i.e., the result of the erase verify operation is determined to be a pass), the process proceeds to step 721. The step 721 is described later.

Step (702) of Detecting Erased Strings

If the erase verify operation at step 701 fails, it is determined on the basis of data stored in latches of the page buffers whether an even string including only erased even memory cells exists. If an even string including only erased even memory cells does not exist, the process returns to step 721. If an even string including only erased even memory cells exists, a pre-program operation 710 for lowering a difference between the threshold voltages of all the even memory cells included in the memory block is performed.

The pre-program operation 710 for reducing a difference between the threshold voltages of the even memory cells includes a step 711 of programming erased even strings, a program pulse supply step 712, a program verify step 713, and a step 714 of raising a program pulse. The steps of the pre-program operation 710 are described in detail below.

Step (711) of Programming Erased Even Strings

If the result of the erase verify operation at step 701 is determined to be a fail, a program operation is performed on the even strings (i.e., erased even strings) including only the erased even memory cells. The even strings including only erased even memory cells and even strings including at least one non-erased even memory cell, may be classified on the basis of data stored in the latches of the relevant page buffers. As described above, at step 701, data '0' is stored in the page buffers corresponding to the even strings including only the erased even memory cells, and data '1' remains in the page buffers corresponding to the even strings including the non-erased even memory cells. Accordingly, when the data stored in the latches of the page buffers is associated with the voltage levels of the even bit lines coupled to the page buffers, the program permission voltage 0 V is supplied to the even bit lines including data '0', and the program inhibition voltage Vcc is supplied to the even bit lines including data '1'.

Program Pulse Supply Step (712)

A program pulse is supplied to all the word lines coupled to the memory block. A program operation using the program pulses is performed in accordance with an ISPP method to prevent the distribution width of the threshold voltages of even memory cells from being widened. Thus, the program pulse first supplied to all the word lines has the lowest level of the levels of the program pulses according to the ISPP method.

When the program pulse is supplied to all the word lines, even memory cells included in even strings coupled to respective even bit lines having voltages of a low level are programmed, but even memory cells included in even strings coupled to respective even bit lines having voltages of a high level are not programmed at step 711. That is, if the program operation is performed on the even strings including only the erased even memory cells, the threshold voltages of the erased even memory cells rise again, so that a difference between the threshold voltages of the non-erased even memory cells is reduced.

Program Verify Step (713)

A program verify operation using a program verify voltage is performed on the even strings on which the program operation has been performed. The program verify voltage has only to be set higher than the target erase voltage. It is, however, preferred that the program verify voltage be set to 0 V because the present program operation is for reducing a difference between the threshold voltages of the erased even memory cells and the threshold voltages of the non-erased even memory cells. This reduction in the difference between the threshold voltage of erased and non-erased memory cells may continue until the erase operation is finished.

Step (714) of Raising Program Pulse

If the result of the program verify operation at step 713 is determined to be a fail, the program pulse is raised. It is preferred that the program pulse be raised by a step pulse in the program operation according to the ISPP method. The steps 712 to 714 are repeatedly performed by gradually raising the program pulse until the result of the program verify operation at step 713 is a pass.

If the result of the program verify operation at step 713 is a pass, the erase verify operation for the odd strings 721 is performed.

Odd String Erase Verify Step (721)

An erase verify operation is performed to verify whether the threshold voltages of memory cells included in the odd strings (hereinafter referred to as 'odd memory cells') are lower than the erase reference voltage. In the erase verify operation, data '1' is inputted to latches used for the erase verify operation, from among the latches of all the page buffers coupled to the odd strings, and the odd bit lines coupled to the odd strings are precharged on the basis of data stored in the latches. That is, if data '1' has been inputted to a latch of a page buffer, the voltages of the odd bit lines are precharged to a high level by associating the data of the latches into the voltage levels of the odd bit lines because the voltages of the input nodes of the latches have a high level.

Next, a target erase voltage is supplied to all the word lines coupled to the memory block, and the drain and source select transistors DST and SST coupled to all the odd memory cells are turned on. Here, the common source line CSL is coupled to the ground terminal. Accordingly, the voltage of an odd bit line (from among all the odd bit lines) coupled to an odd string including only odd memory cells having a threshold voltage lower than the target erase voltage is lowered because a current path is formed between the odd bit line and the ground terminal coupled to the common source line CSL. However, the voltage of an odd bit line (from among all the odd bit lines) coupled to an odd string including at least one odd memory cell having a threshold voltage higher than the target erase voltage, from among all the odd bit lines, maintains a precharge level because a current path is not formed between the odd bit line and the ground terminal. Next, it determined whether the odd memory cells included in each odd string have been erased by associating the data of the latches of all the page buffers with the voltage levels of all the odd bit lines. More specifically, data stored in the latch of a page buffer coupled to an odd bit line having a lowered voltage is changed from '1' to '0', but the latch of the page buffer coupled to the odd bit line maintaining the precharge level maintains data '1'.

Step (722) of Detecting Erased Strings

If the result of the erase verify operation at step 721 is determined to be a fail, it is determined whether an odd string including only erased odd memory cells exists in the odd strings on the basis of data stored in the page buffers. If, as result of the determination, an odd string including only erased odd memory cells does not exist, the process returns to step 741 of supplying an erase pulse. If, as result of the determination, an odd string including only erased odd memory cells exists, a pre-program operation 730 of lowering a difference between the threshold voltages of all the odd memory cells included in the memory block is performed.

The pre-program operation 730 includes a step 731 of programming erased odd strings, a program pulse supply step 732, a program verify step 733, and a step 734 of raising a program pulse. The steps of the pre-program operation 730 are described in detail below.

Erase Pulse Supply Step (741)

If data '1' stored in all the page buffers are changed into '0' (i.e., the result of the erase verify operation for the odd strings is determined to be a pass) after the data stored in the page buffers is associated with the voltage levels of the bit lines, the even and the odd memory cells are erased by supplying the erase pulse to the well of the memory block. More specifically, all the word lines coupled to the memory block are floated or the ground voltage 0 V is supplied to all the word lines and the power source voltage Vcc is supplied to all the bit lines of the memory block. Next, all the memory cells coupled to all the word lines are erased by supplying the erase pulse to the well of the memory block.

After the erase pulse is supplied, the steps 701, 702, 721, 722, 730, and 741 are repeatedly performed until the result of the erase verify operation for the odd strings is a pass.

Although the erase verify operation is performed on the even strings at step 701, the pre-program operation 710 is not performed on the even strings because the result of the erase verify operation for the even strings is already a pass if the erase pulse has been supplied at step 741.

If the result of the erase verify operation for the odd strings at step 721 is determined to be a pass, the erase operation of the memory block is finished or a soft program and erase verify operation 750 may be further performed to further narrow the distribution width of the threshold voltages of the memory cells. The soft program and erase verify operation 750 is performed as follows.

Soft Program Step (751)

A soft program operation is performed on all the erased memory cells included in the erased memory block. The soft program operation is performed to further narrow the distribution width of the threshold voltages of the erased memory cells while raising the threshold voltages of the erased memory cells by a specific level. The soft program operation may be performed in accordance with an ISPP method. More specifically, the soft program operation may be performed as in step 421 of FIG. 4 and may be performed by dividing the erased memory cells into even memory cells and odd memory cells.

Soft Erase Verify Stein (752)

If the result of the soft program verify operation at step 751 is a pass, a soft erase verify operation is performed on all memory cells to verify whether there is a memory cell having a threshold voltage higher than the highest level defined as an erase state. That is, in the soft program operation at step 751, if the threshold voltages of the memory cells only have to reach the target soft program voltage, the memory cells are treated as a pass, thereby making it difficult to know how much the threshold voltages have risen. That is, excessively soft-programmed cells may exist. In the soft erase verify operation, the highest voltage—of voltages defined as erase states—is set as the target soft erase voltage. If, as a result of the soft erase verify operation, memory cells having threshold voltages each equal to the target soft erase voltage are not detected, the erase operation for the memory block is treated as a pass and the erase operation is then finished. If, as a result of the soft erase verify operation, a memory cell having a threshold voltage dropped to the target soft erase voltage is detected, the erase operation for the memory block is treated as a fail at step 753.

As described above, since a difference between the threshold voltages of erased memory cells and the threshold voltages of non-erased memory cells is reduced and an erase operation is then performed, the distribution width of the threshold voltages of erased memory cells can be narrowed. Accordingly, the time taken to perform a subsequent program operation can be reduced because the threshold voltages of memory cells included in a memory block can be rapidly raised in the program operation.

Furthermore, a drop in the threshold voltages of memory cells included in an erased memory block can be suppressed, and the distribution width of the threshold voltages of erased memory cells can be prevented from increasing. Accordingly, the time taken to perform a program operation for the erased memory cells can be reduced.

What is claimed is:

1. An erase method of a semiconductor device, comprising:
performing an operation comprised of supplying an erase pulse to erase memory cells of a memory block;
performing an erase verify operation for detecting memory cells of the memory block having threshold voltages dropped to a target erase voltage;
performing a pre-program operation on the memory cells having the threshold voltages dropped to the target erase voltage, if, as a result of the erase verify operation, the memory block comprises memory cells having the threshold voltages higher than the target erase voltage and the memory cells having the threshold voltages dropped to the target erase voltage; and
repeating the operation of supplying an erase pulse, the erase verify operation, and the pre-program operation until the threshold voltages of all the memory cells drop to the target erase voltage.

2. The erase method of claim 1, wherein the erase pulse is supplied to a well of the memory block.

3. The erase method of claim 1, wherein the pre-program operation is performed on only the memory cells having the threshold voltages dropped to the target erase voltage.

4. The erase method of claim 3, wherein the pre-program operation is performed by supplying a program permission voltage to bit lines coupled to strings each including only memory cells having the threshold voltages dropped to the target erase voltage, and supplying a program inhibition voltage to remaining bit lines.

5. The erase method of claim 4, wherein the pre-program operation is performed in accordance with an incremental step pulse program (ISPP) method of gradually raising a program voltage.

6. The erase method of claim 1, wherein a target voltage of the pre-program operation is 0 V.

7. An erase method of a semiconductor device, comprising:
performing an erase operation comprised of erasing memory cells included in a plurality of strings by performing an operation of supplying an erase pulse to a memory block including the strings;
performing an erase verify operation for verifying whether threshold voltages of the memory cells have dropped to a target erase voltage; and
finishing the erase operation if, as a result of the erase verify operation, the threshold voltages of all the memory cells have dropped to the target erase voltage, and performing a pre-program operation for raising the threshold voltages of the erased memory cells if, as a result of the erase verify operation, a memory cell having a threshold voltage not dropped to the target erase voltage exists in the memory cells, wherein the operation of supplying the erase pulse, the erase verify operation, and the pre-program operation are repeated until the threshold voltages of all the memory cells drop to the target erase voltage.

8. The erase method of claim 7, wherein the pre-program operation is performed by supplying a program permission voltage to bit lines coupled to strings including only erased memory cells, from among the plurality of strings, and supplying a program inhibition voltage to bit lines coupled to strings including at least one memory cell that is not erased.

9. The erase method of claim 8, wherein the pre-program operation is performed in accordance with an incremental step pulse program (ISPP) method of gradually raising a program voltage.

10. The erase method of claim 9, wherein the pre-program operation comprises:
supplying a program pulse to all word lines coupled to the memory cells;
performing a program verify operation for verifying whether the threshold voltages of the memory cells have reached a program verify voltage;
supplying the erase pulse if, as a result of the program verify operation, the threshold voltages of all the programmed memory cells have risen to the program verify voltage and raising the program pulse if, as a result of the program verify operation, a memory cell having the threshold voltage not risen to the program verify voltage exists in all the programmed memory cells; and repeating the pre-program operation while gradually raising the program pulse until the threshold voltages of all programmed memory cells reach the program verify voltage.

11. The erase method of claim 7, further comprising performing a soft program operation for raising the threshold voltages of all the erased memory cells, before finishing the erase operation if, as a result of the erase verify operation, the threshold voltages of all the memory cells have dropped to the target erase voltage.

12. The erase method of claim 11, wherein the soft program operation comprises:

supplying a program permission voltage to all bit lines coupled to the plurality of strings;

supplying a program pulse to all word lines coupled to all the memory cells; and performing a soft program verify operation for verifying whether the threshold voltages of all the memory cells have reached a target soft program voltage, wherein the soft program operation is repeated until the threshold voltages of all the memory cells reach the target soft program voltage.

13. The erase method of claim 11, further comprising performing a soft erase verify operation for detecting excessively programmed memory cells, from among all the memory cells, after the soft program operation is finished.

14. The erase method of claim 13, wherein the soft erase verify operation is performed by setting a voltage, having a highest level of levels defined as an erase state, as a target soft erase voltage.

15. The erase method of claim 14, wherein:

finishing the erase operation, if, as a result of the soft erase verify operation, a memory cell having the threshold voltage reached the target soft erase voltage is not detected, and treating the erase operation as a fail, if, as a result of the soft erase verify operation, a memory cell having the threshold voltage reaching the target soft erase voltage is detected.

16. An erase method of a semiconductor device, comprising:

performing an erase operation comprised of erasing memory cells of a memory block by supplying an erase pulse to the memory block including even and odd strings;

performing a first erase verify operation on the even strings;

performing a first program operation for reducing a difference between threshold voltages of memory cells included in the even strings if a result of the first erase verify operation is a fail;

repeating the operation of supplying the erase pulse, the first erase verify operation, and the first program operation until a result of the first erase verify operation is a pass;

performing a second erase verify operation on the odd strings if a result of the first erase verify operation is a pass;

performing a second program operation for reducing a difference between threshold voltages of memory cells included in the odd strings if a result of the second the erase verify operation is a fail;

repeating the operation of supplying the erase pulse, the first erase verify operation, the second erase verify operation, and the second program operation until a result of the second erase verify operation is a pass; and finishing the erase operation if a result of the second erase verify operation is a pass.

17. The erase method of claim 16, wherein the erase pulse is supplied to a well of the memory block.

18. The erase method of claim 16, wherein the erase pulse is gradually raised whenever the operation of supplying the erase pulse, the first erase verify operation, and the first program operation are performed.

19. The erase method of claim 16, wherein the first erase verify operation is performed on only the even strings.

20. The erase method of claim 16, wherein the first program operation is performed by raising threshold voltages of erased memory cells included in even strings including only erased memory cells to reduce a threshold voltage difference between the memory cells included in the even strings.

21. The erase method of claim 16, wherein the erase pulse is gradually raised whenever the operation of supplying the erase pulse, the first erase verify operation, the second erase verify operation, and the second program operation are repeated.

22. The erase method of claim 16, wherein the second erase verify operation is performed on only the odd strings.

23. The erase method of claim 16, wherein the second program operation is performed by raising threshold voltages of erased memory cells included in odd strings including only erased memory cells to reduce a threshold voltage difference between the memory cells included in the odd strings.

24. The erase method of claim 16, further comprising performing a soft program operation for raising the threshold voltages of all the erased memory cells before finishing the erase operation, if a result of the second erase verify operation is a pass.

25. The erase method of claim 24, wherein the soft program operation comprises:

supplying a program permission voltage to all bit lines coupled to the even and odd strings;

supplying a program pulse to all word lines coupled to the memory cells included in the even and odd strings; and performing a soft program verify operation for verifying whether the threshold voltages of all the memory cells have reached a target soft program voltage, wherein the soft program operation is repeated until the threshold voltages of all the memory cells reach the target soft program voltage.

26. The erase method of claim 25, further comprising performing a soft erase verify operation for detecting excessively programmed memory cells, from among all the memory cells, after the soft program operation is finished.

27. The erase method of claim 26, wherein the soft erase verify operation is performed by setting a voltage, having a highest level of levels defined as an erase state, as a target soft erase voltage.

28. The erase method of claim 26, wherein:

finishing the erase operation, if, as a result of the soft erase verify operation, a memory cell having the threshold voltage reached a target soft erase voltage is not detected, and treating the erase operation as a fail, if, as a result of the soft erase verify operation, a memory cell having the threshold voltage reached a target soft erase voltage is detected.

29. An erase method of a semiconductor device, comprising:
- performing an erase verify operation for verifying whether threshold voltages of all memory cells included in a memory block is lower than a target erase voltage;
- repeating a pre-program operation until threshold voltages of erased memory cells, from among all the memory cells, reach a target program voltage, if a result of the erase verify operation is a fail;
- performing an erase operation by supplying an erase pulse to erase all the memory cells when the threshold voltages of the erased memory cells reach the target program voltage; and
- repeating the erase verify operation, the pre-program operation, and the operation of supplying the erase pulse until the threshold voltages of all the memory cells drop to the target erase voltage.

30. The erase method of claim 29, wherein a result of the erase verify operation is a fail if at least one memory cell having a threshold voltage not reached the target erase voltage is detected and is a pass if the threshold voltages of all the memory cells reaches the target erase voltage.

31. The erase method of claim 29, wherein the erase pulse is supplied to a well of the memory block.

32. The erase method of claim 31, wherein the erase pulse is gradually raised whenever the erase verify operation and the erase operation are repeated.

33. The erase method of claim 29, further comprising performing a soft program operation for raising the threshold voltages of all the erased memory cells before finishing the erase operation, if the threshold voltages of all the memory cells drop to the target erase voltage.

34. The erase method of claim 33, wherein the soft program operation comprises:
- supplying a program permission voltage to all bit lines coupled to all the memory cells;
- supplying a program pulse to all word lines coupled to all the memory cells; and
- performing a soft program verify operation for verifying whether the threshold voltages of all the memory cells have reached a target soft program voltage, wherein the soft program operation is repeated until the threshold voltages of all the memory cells reach the target soft program voltage.

35. The erase method of claim 34, wherein the target soft program voltage is lower than 0 V and higher than the target erase voltage.

36. The erase method of claim 34, further comprising performing a soft erase verify operation for detecting excessively programmed memory cells, from among all the memory cells, after the soft program operation is finished.

37. The erase method of claim 36, wherein the soft erase verify operation is performed by setting a voltage, having a highest level of levels defined as an erase state, as a target soft erase voltage.

38. The erase method of claim 36, wherein:
- finishing the erase operation, if, as a result of the soft erase verify operation, a memory cell having the threshold voltage reached the target soft erase voltage is not detected, and treating the erase operation as a fail, if, as a result of the soft erase verify operation, a memory cell having the threshold voltage reached the target soft erase voltage is detected.

39. An erase method of a semiconductor device, comprising:
- performing a first erase verify operation on even strings;
- repeating a first program operation until threshold voltages of erased memory cells included in the even strings reach a first target voltage, if a result of the first erase verify operation is a fail;
- performing a second erase verify operation on odd strings, if a result of the first erase verify operation is a pass or the threshold voltages of all the memory cells included in the even strings reach the first target voltage;
- repeating a second program operation until threshold voltages of erased memory cells included in the odd strings reach a second target voltage, if a result of the second erase verify operation is a fail;
- performing an erase operation for erasing the even and odd strings by supplying an erase pulse, if the threshold voltages of all the memory cells included in the odd strings reach the second target voltage; and
- repeating the first erase verify operation, the second erase verify operation, the second program operation, and the operation of supplying the erase pulse until a result of the second erase verify operation is a pass.

40. The erase method of claim 39, further comprising performing a soft program operation for raising the threshold voltages of all the erased memory cells before finishing the erase operation, if a result of the second erase verify operation is a pass.

41. The erase method of claim 40, wherein the soft program operation comprises:
- supplying a program permission voltage to all bit lines coupled to the even and odd strings;
- supplying a program pulse to all word lines coupled to all the memory cells; and
- performing a soft program verify operation for verifying whether the threshold voltages of all the memory cells have reached a target soft program voltage, wherein the soft program operation is repeated until the threshold voltages of all the memory cells reach the target soft program voltage.

42. The erase method of claim 40, further comprising performing a soft erase verify operation for detecting excessively programmed memory cells, from among all the memory cells, after the soft program operation is finished.

43. The erase method of claim 42, wherein the soft erase verify operation is performed by setting a voltage, having a highest level of levels defined as an erase state, as the target soft erase voltage.

44. The erase method of claim 43, wherein:
- finishing the erase operation, if, as a result of the soft erase verify operation, a memory cell having the threshold voltage reached the target soft erase voltage is not detected, and treating the erase operation as a fail, if, as a result of the soft erase verify operation, a memory cell having the threshold voltage reached the target soft erase voltage is detected.

45. A semiconductor device, comprising:
- a memory block configured to comprise a plurality of memory cells;
- a circuit group configured to detect a program state or an erase state of the memory cells, and program or erase the memory cells; and
- a controller configured to control the circuit group to perform an erase operation on the memory cells, perform an erase verify operation for detecting memory cells having threshold voltages dropped to a target erase voltage, perform a pre-program operation on the memory cells having the threshold voltages dropped to the target erase voltage, and repeat the erase operation, the erase verify operation and the pre-program operation until the threshold voltages of all the memory cells drop to the target erase voltage.

46. The semiconductor device of claim 45, wherein the circuit group comprises:
   a voltage generator configured to output operating voltages for programming, erasing, or reading the memory cells to global lines coupled to the memory block in response to an internal command signal generated from the controller;
   a row decoder configured to transfer the operating voltages to local lines of the memory block in response to row address signals generated from the controller;
   a page buffer group configured to store data, wherein the page buffer group comprises a plurality of page buffers;
   a column selector configured to select the page buffers in response to a column address signal generated from the controller;
   an I/O circuit configured to transfer external input data to the column selector under control of the controller so that the external input data is inputted to the page buffers and externally outputting data received from the page buffers through the column selector; and
   a pass/fail check circuit configured to check whether there is an error memory cell in a verify operation for the memory cells, output a result of the check to the controller, count a number of the error memory cells, and output a result of the count to the controller.

47. The semiconductor device of claim 46, wherein the memory block comprises a plurality of strings including the plurality of memory cells.

48. The semiconductor device of claim 47, wherein the strings are coupled to the page buffers through bit lines.

49. The semiconductor device of claim 48, wherein the bit lines are coupled to respective page buffers or a pair of the bit lines are coupled to each of the page buffers.

* * * * *